United States Patent [19]

Asazawa

[11] Patent Number: 4,591,802
[45] Date of Patent: May 27, 1986

[54] FEEDBACK AMPLIFIER CIRCUIT INCLUDING CASCADE CONNECTED FIELD EFFECT TRANSISTORS

[75] Inventor: Hiroshi Asazawa, Tokyo, Japan

[73] Assignee: NEC Corporation, Tokyo, Japan

[21] Appl. No.: 730,335

[22] Filed: May 3, 1985

[30] Foreign Application Priority Data

May 8, 1984 [JP] Japan .................................. 59-90225

[51] Int. Cl.⁴ ............................................. H03F 3/16
[52] U.S. Cl. .................................... 330/277; 330/302; 330/293
[58] Field of Search ............... 330/277, 290, 291, 293, 330/294, 302, 310, 311

[56] References Cited

PUBLICATIONS

Riml, Peter, "13 cm GaAsFET Preamp", *QST*, Aug. 1984, p. 65.
Ananér, L. L., Egorov, N. V. and Pozharov, A. M., "A Coded Amp w/FETs Having a Noise Temp of 1K", *Cryogenics*, May 1978, v. 18, No. 5, pp. 308–309.

*Primary Examiner*—James B. Mullins
*Assistant Examiner*—Steven J. Mottola
*Attorney, Agent, or Firm*—Laff, Whitesel, Conte & Saret

[57] ABSTRACT

A multistage type amplifier circuit comprises a plurality of FETs cascade-connected to each other through interstage capacitors. The first amplifier stage of an FET is additionally provided with a feedback circuit coupled between respective gates of the first-stage FET and the next stage FET. The next amplifier stage of an FET is also provided with a similar feedback circuit coupled between respective drains of the first and next stage FETs successively connected. Thus, this makes it possible to reduce the required number of dc block capacitors to less than one-half, resulting in a small area occupation of capacitors when IC is realized. Further, the amplifier circuit is configured so that each amplifier stage is not provided with a dc block capacitor in the negative feedback circuit, leading to a significant improvement in frequency characteristics of the amplifier circuit in a low frequency range.

16 Claims, 2 Drawing Figures

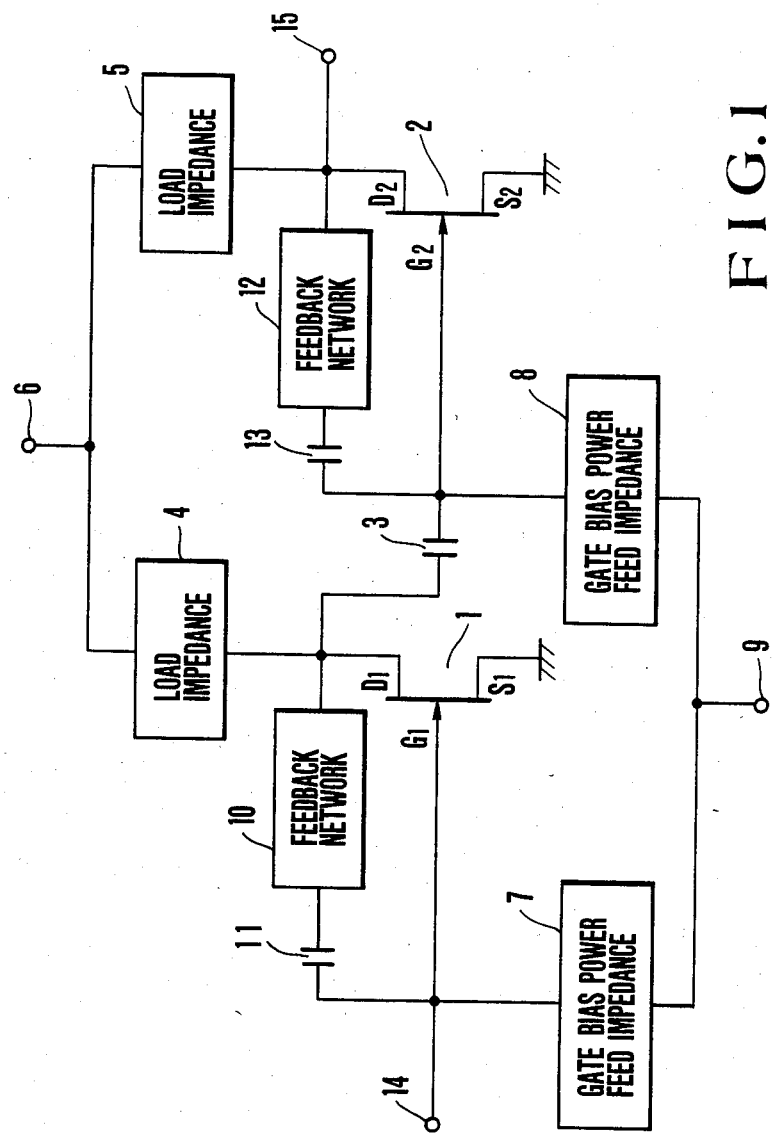
F I G. 1

FEEDBACK AMPLIFIER CIRCUIT INCLUDING CASCADE CONNECTED FIELD EFFECT TRANSISTORS

BACKGROUND OF THE INVENTION

The present invention relates to a multistage amplifier circuit constituted by cascade-connecting at least two field effect transistors (FETs), and more particurlarly to a simplified feedback type amplifier circuit which can improve frequency characteristics in a low frequency range.

Initially, a two-stage amplifier circuit as an example of a conventional multistage amplifier circuit constituted with at least two FETs cascade-connected to each other will be described with reference to FIG. 1. This amplifier circuit comprises a first-stage FET 1, the next (second)-stage FET 2 cascade-connected to the FET 1, and an interstage capacitor 3 connected between a drain $D_1$ of the FET 1 and a gate $G_2$ of the FET 2. Both drains $D_1$ and $D_2$ of the FETs 1 and 2 are connected commonly to a drain bias power supply terminal 6 through load impedances 4 and 5, respectively. Further, sources Shd 1 and $S_2$ are grounded and gates Gand $G_2$ are connected to a gate bias terminal 9 through gate bias power feed impedances 7 and 8, respectively. To provide a flat gain over a wide frequency band, a first amplifier stage comprised of the FET 1 is provided between the drain $D_1$ and the gate $G_1$ with a series circuit comprising first-stage feedback network 10 and a capacitor 11 for blocking a dc component of a feedback signal (which will be called a dc block capacitor 11 hereinafter). Likewise, the second amplifier stage comprised of the FET 2 is provided between the drain $D_2$ and the gate $G_2$ with a series circuit comprising a second stage feedback network 12 and a capacitor 13 for blocking a dc component of a feedback signal (which will be called a dc block capacitor 13 hereinafter). The amplifier circuit further comprises an input terminal 14 which is connected to the gate $G_1$ of the FET 1, and an output terminal 15 which is connected to the drain $D_2$ of the FET 2.

In the amplifier circuit thus configured, when an input signal is supplied to the gate $G_1$ through the input terminal 14, the input signal is amplified by the FET 1. The amplified output from the drain $D_1$ of the FET 1 is inputted to the gate $G_2$ through the interstage capacitor 3 and then is amplified by the FET 2, thus producing an output signal on the output terminal 15 connected to the drain $D_2$ of the FET 2. In this amplifier circuit, negative feedbacks are implemented to both the FETs 1 and 2 through the first-stage feedback network 10 and the dc block capacitor 11 and through the second-stage feedback network 12 and the dc block capacitor 13, respectively.

However, since the conventional multistage amplifier circuit configured as shown in FIG. 1 is provided with a feedback circuit per each amplifier stage, it requires dc block capacitors 11 and 13 in the respective feedback loops in addition to the interstage dc block capacitor 3.

For this reason, in general, when n stages of amplifiers are configured with such a conventional amplifier circuit, (2n−1) capacitors are required, leading to the drawbacks that circuit configuration becomes complicated and this conventional system is not economical. In addition, it has the drawback in characteristics that frequency characteristics of the amplifier in a low frequency range is limited by the capacitance, except for the interstage capacitor, existing in each feedback loop.

Further, when the above-mentioned amplifier circuit is configured as an integrated circuit (IC), the total capacitance value of capacitors has a great influence on the IC size to such a degree that it determines the IC size. For this reason, it is strongly required that the capacitance value of capacitors in the IC is as small as possible. To satisfy this requirement, first is to take the measure for reducing the number of capacitors used and second is to take the measure for configuring the IC at a minimum capacitance value required.

SUMMARY OF THE INVENTION

In view of the above, the present invention has been made so as to eliminate such drawbacks and meet the above requirements and has for its object to provide an amplifier circuit which can improve frequency characteristic in a low frequency range with a simplified circuit configuration.

According to the present invention, there is provided an amplifier circuit comprising n number of amplifier stages each comprising a field-effect transistor, cascade-connected to each other (n is an integer equal to or more than two) through interstage capacitors, respectively, the improvement wherein the (i−1)th amplifier stage (i=2, 3, 4 . . . n) is provided with a feedback circuit comprising impedance circuit means functioning to allow a dc component of a feedback signal to pass therethrough, the impedance circuit means being coupled between respective gates of the (i−1)th stage and the i-th stage field-effect transistors; and the i-th amplifier stage is provided with a feedback circuit comprising impedance circuit means having the same function as that of the impedance circuit means of the feedback circuit provided in the (i−1)th amplifier stage, the impedance cirduit means provided in the i-th amplifier stage being coupled between respective drains of the i-th and the (i−1)th stages.

The impedance circuit means may be configured as an impedance circuit of less capacitive nature. The impedance circuit may comprise a resistance element, an inductance element, or a network comprising resistance and inductance elements coupled thereto.

The gate of the (i−1)th stage field-effect transistor has the same potential as that of the i-th stage field-effect transistor. The drain of the i-th stage field-effect transistor has the same potential as that of the (i−1)th stage field-effect transistor.

Further, gates of the n number of field-effect transistors may be commonly connected to a gate bias terminal through impedance elements, respectively, drains of the n number of field-effect transistors may be commonly connected to a drain bias power supply terminal through load impedance elements, respectively.

BRIEF DESCRIPTION OF THE DRAWING

The features and advantages of an amplifier circuit according to the present invention will become more apparent from the following description taken in conjunction with the accompanying drawing, in which:

FIG. 1 is a circuit diagram illustrating an example of a conventional amplifier circuit.

DETAILED DESCRIPTION OF PREFERRED EMBODIMENT

Figure 2:
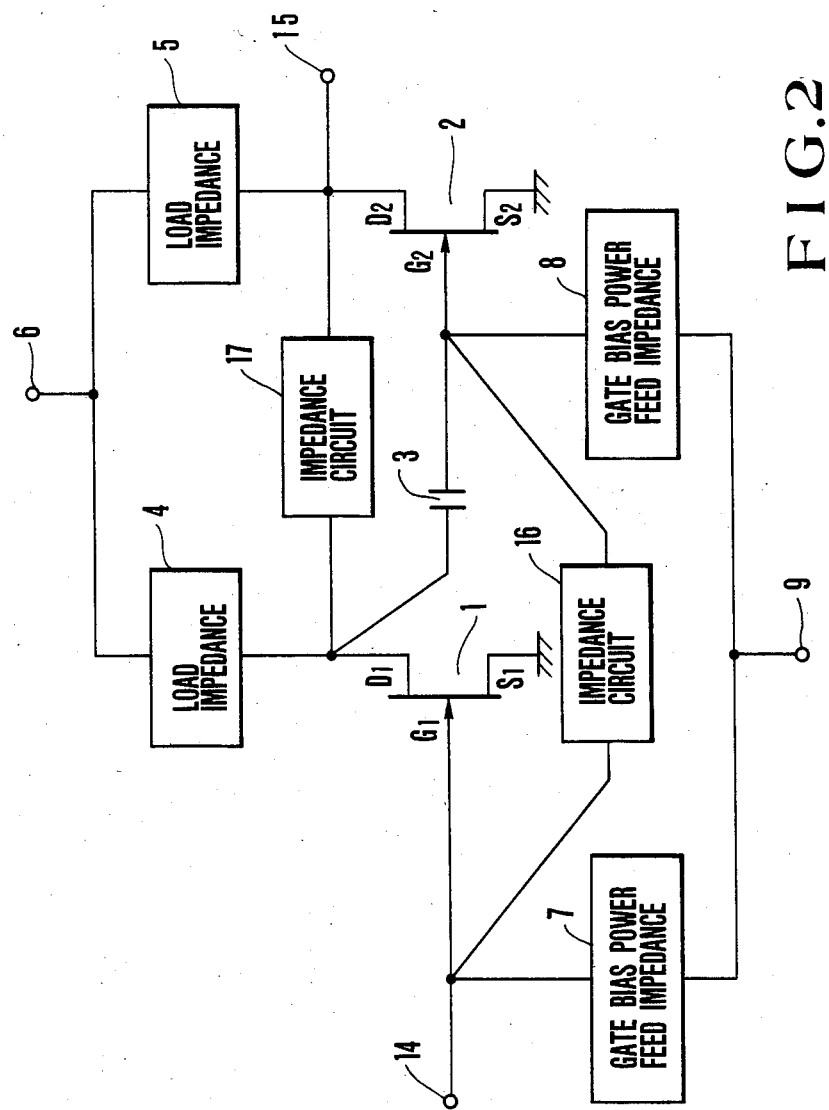
FIG. 2 is a circuit diagram illustrating an embodiment of an amplifier circuit according to the present invention.

A preferred embodiment of an amplifier circuit according to the present invention will be described with reference to attached drawing.

FIG. 2 is a circuit diagram illustrating the embodiment of an amplifier circuit comprising a plurality of FETs successively connected to each other wherein by way of example, there is shown a two-stage amplifier circuit configured so that an input signal is applied to the gate of the first stage amplifier to produce an output signal from the drain of the next stage amplifier.

In FIG. 2, parts designated by the same reference numerals as those in FIG. 1 show corresponding ones, respectively, and therefore their explanation will be omitted. The embodiment of the present invention is characterized in that there are provided a first impedance circuit means 16 for negative feedback which connects the gate $G_1$ of the first-stage FET 1 to the gate $G_2$ of the next-stage FET 2, and a second impedance circuit means 17 for negative feedback which connects the drain $D_1$ of the first-stage FET 1 to the drain $D_2$ of the next stage FET 2. These first and second impedance circuit means provide impedance of feedback circuits provided in the first and second amplifier stages comprising FET 1 and the FET 2, respectively. Each impedance circuit means functions to allow a dc component of a feedback signal to pass therethrough. That is, this impedance circuit means is configured as an impedance circuit of less capacitive nature. For example, the impedance circuit comprises a resistance element, an inductance element, or a network comprising resistance and inductance elements coupled to each other.

The operation of the embodiment shown in FIG. 2 will be described.

An input signal from the input terminal 14 is applied to the gate $G_1$ of the first-stage FET 1 and is amplified thereby. An output signal from the drain $D_1$ of the first-stage FET 1 is inputted to the gate $G_2$ of the next-stage FET 2 and is amplified thereby. Thus, an output signal is produced on the output terminal 15 connected to the drain $D_2$ of the next-stage FET 2.

With an improvement in a feedback system in mind, in this embodiment, there is provided the circuit component 16 functioning as impedance for negative feedback which provides a feedback impedance of the first-stage FET 1 between both gates $G_1$ and $G_2$ of the FET 1 and FET 2, at which potentials are equal to each other. In this instance, when the amplifier circuit is caused to be operative under the condition where no current flows between the gate bias terminal 9 and each gate of the FETs, either of circuit elements 7 and 8 providing gate bias power feed impedance can be omitted.

In this instance, by suitably selecting the device parameters of the FET 1 and the FET 2 and the values of the load impedances 4 and 5, a potential at the drain $D_1$ of the FET 1 can be equal to a potential at the drain $D_2$ of the FET 2. By further providing a circuit component 17 functioning as impedance for negative feedback between the drains $D_1$ and $D_2$ of the FET 1 and the FET 2 and as a feedback circuit of the second-stage FET 2, it is possible to constitute a feedback type amplifier circuit without a dc block capacitor in the feedback loop.

In the above-mentioned embodiment, it has been described that the present invention is applied to the two-stage amplifier circuit. However, the present invention is not limited to this embodiment. It is needless to say that the present invention is applicable to a multi-stage amplifier circuit comprising a plurality of FETs cascade-connected to each other.

Accordingly, when generally realizing n stages of feedback amplifiers by making use of this circuit system, the number of dc block capacitors required therefor is $(n-1)$. Thus, the improved amplifier circuit makes it possible to reduce the number of capacitors to less than one-half as compared to the $(2n-1)$ capacitors required for the conventional amplifier circuit. Further, it is possible to omit each dc block capacitor provided in the feedback loop except for the dc block capacitor of the elementary feedback circuit in the first-amplifier stage. Thus, circuit configuration becomes simple, resulting in low cost and improvement in frequency characteristics in a low frequency range.

As stated above, the present invention can provide a simplified circuit configuration by improving the feedback system in a multistage type amplifier without using complicated means. Accordingly, this circuit is extremely advantageous in a practical use as follows: It is possible to reduce the required number of dc block capacitors to less than one-half when compared to the prior art circuit and to reduce the area of capacitors which is an important factor for determining the chip area when realizing an integrated circuit. Further, the feedback loop newly employed by the present invention is not provided with a dc block capacitor, thus enabling the improvement in frequency characteristics of the amplifier in a low frequency range. In addition, the amplifier circuit of the invention is quite effective in that the price can be reduced due to realization of simplified configuration.

What is claimed is:

1. An amplifier circuit comprising n number of amplifier stages each comprising a field-effect transistor, cascade-connected to each other (n is an integer equal to or more than two) through interstage capacitors, respectively, the improvement wherein (a) the $(i-1)$th amplifier stage ($i=2, 3, 4 \ldots n$) is provided with a feedback circuit comprising impedance circuit means functioning to allow a dc component of a feedback signal to pass therethrough, said impedance circuit means provided in said $(i-1)$th amplifier stage being coupled between respective gates of said $(i-1)$th-stage and the i-th stage field-effect transistors, and (b) the i-th amplifier stage is provided with a feedback circuit comprising impedance circuit means having the same function as that of said impedance circuit means of said feedback circuit provided in said $(i-1)$th amplifier stage, said impedance circuit means provided in said i-th amplifier stage being coupled between respective drains of the i-th and the $(i-1)$th amplifier stages.

2. The amplifier circuit as set forth in claim 1, wherein each of said impedance circuit means is configured without a capacitor.

3. The amplifier circuit as set forth in claim 1, wherein each of said impedance circuit means comprises at least a resistance element and an inductance element.

4. An amplifier circuit as set forth in claim 1, wherein the gate of said $(i-1)$th-stage field-effect transistor has the same potential as that of said i-th stage field-effect transistor.

5. An amplifier circuit as set forth in claim 1, wherein the drain of said i-th stage field-effect transistor has the same potential as that of the (i−1)th stage field-effect transistor.

6. An amplifier circuit as set forth in claim 1, wherein gates of said n number of field-effect transistors are commonly connected to a gate bias terminal through impedance elements, respectively.

7. An amplifier circuit as set forth in claim 6, wherein when the amplifier circuit is operative under the condition where no current flows between each of gates of said n number of field-effect transistors and said gate bias terminal, the number of said impedance elements is reduced to at least one-half.

8. An amplifier circuit as set forth in claim 1, wherein drains of said n number of field-effect transistors are commonly connected to a drain bias power supply terminal through load impedance elements, respectively.

9. An amplifier circuit as set forth in claim 1, wherein said first-stage field-effect transistor is provided with an input terminal coupled to the gate thereof, and the final stage field-effect transistor is provided with an output terminal coupled to the drain thereof.

10. An amplifier circuit comprising at least two stages of field-effect transitors cascade-connected to each other, the amplifier circuit comprising:
(a) an input terminal for an input signal provided in the (i−1)th stage field effect transistor, (i being an integer equal to or more than two)
(b) an interstage capacitor coupled to each interstage of the field-effect transistors successively connected to each other,
(c) first impedance circuit means for negative feedback functioning to allow a dc component of a feedback signal to pass therethrough, said first impedance circuit means being coupled between respective gates of said (i−1)th-stage and the i-th stage field-effect transistors,
(d) second impedance circuit means for negative feedback having the same function as that of said first impedance circuit means, said second impedance circuit means being coupled between drains of (i−1)th and i-th field-effect transistors successively connected to each other, respectively, and
(e) an output terminal coupled to the drain of the final-stage of the field-effect transistor, thereby to output an amplifier signal from said output terminal.

11. The amplifier circuit as set forth in claim 10, wherein each of said first and second impedance circuit means is configured as a capacitor free circuit.

12. An amplifier circuit as set forth in claim 11, wherein said impedance circuit comprises at least a resistance element and an inductance element.

13. An amplifier circuit as set forth in claim 10, wherein the gate of said (i−1)th-stage field-effect transistor has the same potential as that of said i-th stage field-effect transistor.

14. The amplifier circuit as set forth in claim 10, wherein each of the drains of said (i−1)th and i-th field effect transistors has the same potential.

15. An amplifier circuit as set forth in claim 10, wherein gates of said field-effect transistors cascade-connected to each other are commonly connected to a gate bias terminal through impedance elements, respectively.

16. An amplifier circuit as set forth in claim 10, wherein drains of said field-effect transistors cascade-connected to each other are commonly connected to a drain bias power supply terminal through load impedance elements, respectively.

* * * * *